United States Patent
Paola

(10) Patent No.: US 6,903,941 B2
(45) Date of Patent: Jun. 7, 2005

(54) PRINTED CIRCUIT BOARD ASSEMBLY EMPLOYING A PRESS FIT ELECTRICAL CONNECTOR

(75) Inventor: Jose Pietri Paola, Aquadilla, PR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 163 days.

(21) Appl. No.: 10/279,586

(22) Filed: Oct. 24, 2002

(65) Prior Publication Data

US 2004/0080921 A1 Apr. 29, 2004

(51) Int. Cl.[7] .............................. H05K 1/11; H05K 1/14
(52) U.S. Cl. ...................... 361/803; 361/790; 439/69
(58) Field of Search .................. 361/790, 803, 361/700–710; 439/69–75, 65; 257/685–686, 700–704

(56) References Cited

U.S. PATENT DOCUMENTS

| | | | |
|---|---|---|---|
| 3,676,932 A | | 7/1972 | Judge et al. |
| 4,773,873 A | | 9/1988 | Hillis |
| 4,912,401 A | * | 3/1990 | Nady et al. .................. 324/755 |
| 5,473,510 A | * | 12/1995 | Dozier, II .................... 361/719 |
| 5,481,435 A | * | 1/1996 | Werther ....................... 361/784 |
| 5,547,389 A | | 8/1996 | Hsu |
| 5,707,247 A | | 1/1998 | Konstad |
| 5,772,451 A | | 6/1998 | Dozier, II et al. |
| 5,842,874 A | * | 12/1998 | Yagi et al. ..................... 439/74 |
| 5,893,770 A | | 4/1999 | Gober |
| 5,931,689 A | * | 8/1999 | Patel ........................... 439/346 |
| 5,982,635 A | * | 11/1999 | Menzies et al. ............. 361/790 |
| 6,004,152 A | | 12/1999 | Walkup et al. |
| 6,099,321 A | | 8/2000 | McHugh et al. |
| 6,106,316 A | | 8/2000 | Barringer et al. |
| 6,186,815 B1 | | 2/2001 | Lin |
| 6,219,241 B1 | | 4/2001 | Jones |

* cited by examiner

Primary Examiner—Randy W. Gibson
Assistant Examiner—Tuan Dinh

(57) ABSTRACT

A printed circuit board (PCB) assembly includes a PCB and an electrical connector. The PCB includes a first major surface and an opposite second major surface. The electrical connector includes a connector component electrically coupled to the PCB. The connector component has a non-conductive body that is adapted to contact and be supported by a first major surface of the PCB.

15 Claims, 5 Drawing Sheets

PRINTED CIRCUIT BOARD ASSEMBLY EMPLOYING A PRESS FIT ELECTRICAL CONNECTOR

TECHNICAL FIELD

This invention relates generally to printed circuit boards (PCB's). In particular, the present invention is a PCB assembly that includes a daughter card electrically connected to a motherboard by way of an electrical connector. The electrical connector employs a press fit (PF) interface to the motherboard and a zero insertion force (ZIF) socket interface to the daughter card.

BACKGROUND OF THE INVENTION

Printed circuit boards (PCB's) with electrical components are widely used in the electronics industry in a variety of products including computers, servers, televisions and telecommunication devices. In the early days of these electronic products, components, such as microprocessor central processing units (CPU's), secondary PCB's, also known as daughter cards, and other major electrical components, were all soldered directly to a primary PCB, also known as a mother board. Although this was a cost efficient mounting method as far as manufacturing was concerned, there was a major drawback. If the component (for convenience to be referred to as a daughter card hereinafter) was found faulty later or a user wanted to upgrade the daughter card, the daughter card had to be unsoldered from the motherboard and a new one resoldered in its place. As daughter cards grew more integrated and sophisticated, the number of solder connections between the motherboard and the daughter card increased, greatly complicating replacement. Moreover, the heat generated during the unsoldering and resoldering process sometimes overheated the motherboard and/or the daughter card rendering them useless or limiting their lifetime.

Because of the above-discussed deficiencies of direct solder mounting of daughter cards, CPU's, etc., low insertion force (LIF) electrical connectors comprising a socket component and a pin component were developed. The LIF socket components were designed to be directly soldered to the motherboard in lieu of soldering the daughter card thereto. LWF sockets provided a plurality of apertures on an upper surface thereof for receiving the pins of the LIF pin component which was soldered directly to the daughter card or was made integral therewith. Each of the apertures contained a spring loaded contact that frictionally gripped each pin as it was inserted. The combined frictional forces of all of the spring-loaded contacts on the pins retained the LWF pin component in the LIF socket component and provided for good electrical contact between the motherboard and the daughter card.

As component size and pin count continued to grow, however, LIF electrical connectors became problematical. The design of LIF electrical connectors required keeping individual aperture friction of the LIF socket component to a minimum to keep total LIF pin component insertion/extraction force to a practical level. However, each spring loaded contact in the LIF socket component required a certain amount of spring force to maintain reliable electrical contact with the respective pin of the LIF pin component. Therefore, as pin count grew, the total spring and frictional force also grew. At some point, the combined frictional force of all of the spring loaded contacts made insertion or extraction of the LIF pin component of the daughter card from the LIF socket component of the motherboard difficult. Sometimes, the required insertion/extraction force bent or folded slightly misaligned pins, placing the entire daughter card at risk. If the insertion/extraction force was not applied uniformly, pins were at risk of being broken. As such, often a special purpose removal tool was required for extracting LIF pin component equipped daughter cards from the LIF socket component equipped motherboard.

Today's electronic products are often designed to operate with improved components (i.e., daughter cards, CPU's, etc.) as they are developed. For example, as an improved daughter card becomes available, a user wishing to increase a PC's performance need only replace the existing daughter card with an upgraded model. Unfortunately, due to the high extraction/insertion forces, many users lack the ability and removal/insertion tools necessary to remove and install LIF pin component equipped daughter cards from LIF socket component equipped mother boards.

In response to this need to upgrade electronics products, zero insertion force (ZIF) electrical connectors were developed. ZWF electrical connectors eliminated the need for the user to apply substantial insertion/extraction forces to upgrade electronics products. Like, LIF electrical connectors, ZIF electrical connectors comprise a socket component and a pin component. Like LIF socket components, ZIF socket components are designed to be directly soldered to the circuit board. ZIF socket components also provide a plurality of apertures on an upper surface thereof for receiving the pins of the ZIF pin component which was soldered directly to the daughter card or was made integral therewith. However, unlike an LIF socket component, the apertures of a ZIF socket component do not contain spring loaded contacts, but accept each pin of the ZIF pin component without substantial frictional resistance. Each aperture of the ZIF socket component includes a rotatable cam. Insertion of the pins of the ZIF pin component into the apertures of the ZIF socket component causes rotation of the cams. This places the pins of the ZIF pin component in a mechanical shear or bind within the apertures of the ZIF socket component. The mechanical bind brings about a reliable electrical contact for each of the pins and apertures, but allows a ZWF pin component equipped daughter card to be readily removed from a ZIF socket component equipped motherboard.

Since the mechanical bind between the pins and apertures of the ZIF electrical connector components is sometimes insufficient to adequately secure the daughter card to the motherboard, other retention mechanisms are employed to accomplish this task. These retention mechanisms typically employ a heat sink that is positioned atop of the daughter card. Mechanical fasteners or lever arms of the retention mechanism that act between the heat sink and the motherboard are then used to adequately secure the daughter card to the motherboard. In this arrangement, the daughter card is in essence "sandwiched" between the heat sink and the motherboard and is held in place by the retention mechanism.

One drawback of this arrangement is that the weight of the heat sink together with the clamping forces provided by the retention mechanism tends to place solder joints, especially the solder joints between the ZIF socket component and the mother board, under compression loading. This compression loading has proved to be problematical, since this compression loading, together with thermal and power cycling, which occurs during use of the mother board/daughter card, tends to adversely affect the integrity of the solder joints between the ZIF socket component and the mother board. In other words, compression loading, power cycling and thermal cycling tends to cause fractures in the solder joints that can weaken the electrical connection between the ZIF socket component and the motherboard. These weakened electrical connections lessen the reliability of the daughter card and mother board interconnect, and the overall reliability of the electronic product employing the motherboard/daughter card, thereby rendering the electronic product useless or at least limiting its lifetime.

There is a need for improved PCB assemblies. In particular, there is a need for an improved PCB assembly that provides a reliable electrical connection between the daughter card and mother board. This electrical connection should not be readily susceptible to deterioration as a result of compression loading, power cycling and/or thermal cycling. Lastly, the PCB assembly should be relatively easy and inexpensive to manufacture.

SUMMARY OF THE INVENTION

The present invention is a printed circuit board (PCB) assembly including a PCB and an electrical connector. In one embodiment, the PCB has a first major surface and an opposite second major surface. The electrical connector includes a connector component electrically coupled to the PCB. The connector component has a nonconductive body that is adapted to contact and be supported by the first major surface of the PCB.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as the same become better understood by reference to the following detailed description when considered in connection with the accompanying drawings, in which like reference numerals designate like parts throughout the figures thereof, and wherein.

DETAILED DESCRIPTION OF THE PREFERRED EMBODIMENTS

Figure 1:
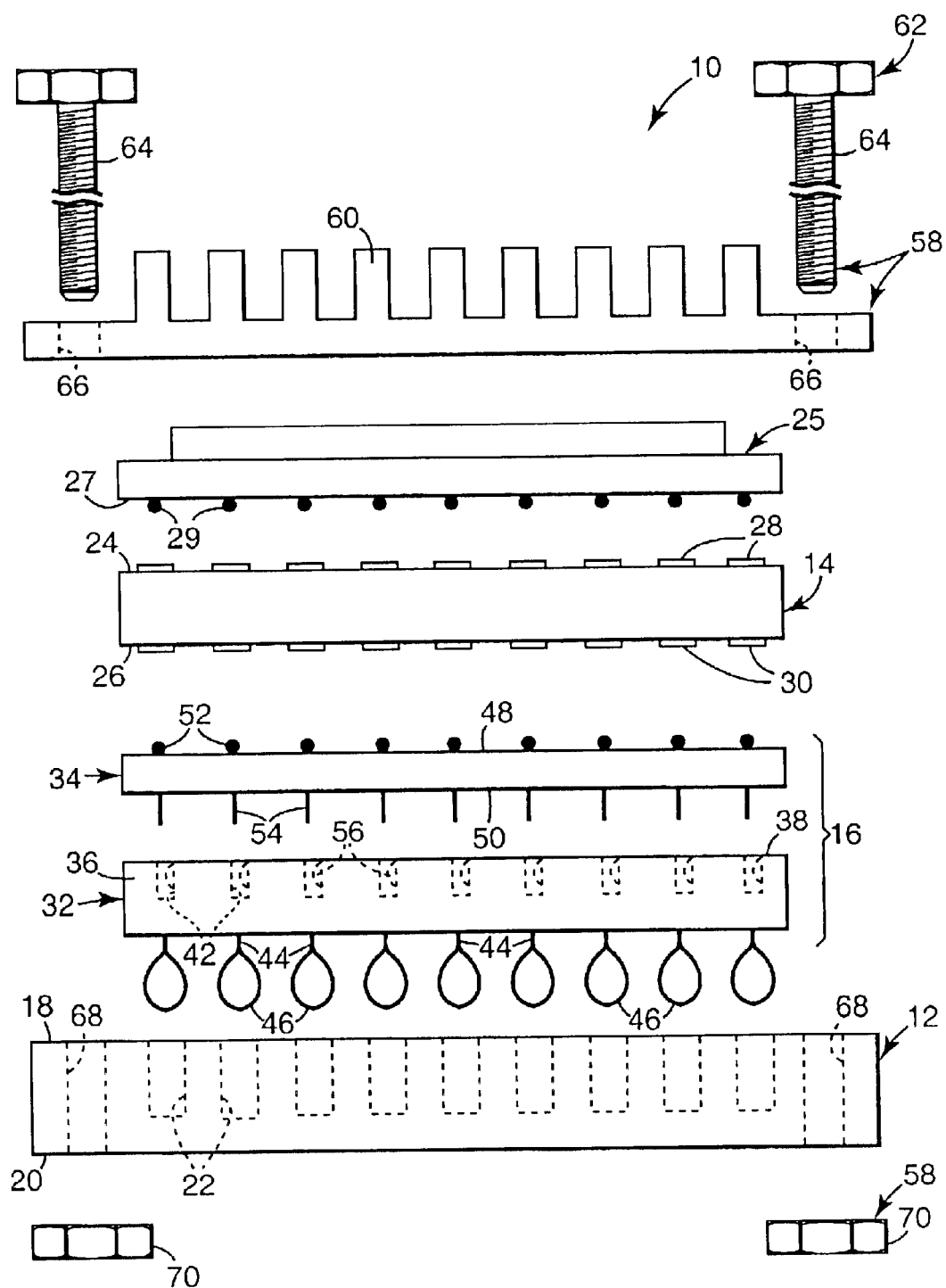
FIG. 1 is an exploded side elevational view of a printed circuit board (PCB) assembly in accordance with one embodiment of the present invention.

A printed circuit board (PCB) assembly 10 in accordance with the present invention is illustrated in FIGS. 1–5. The PCB assembly 10 includes a first PCB or motherboard 12, a second PCB or daughter card 14 and an electrical connector 16 for electrically connecting the daughter card 14 to the motherboard 12. The motherboard 12 is defined by a first or upper major surface 18, and an opposite second or lower major surface 20. As seen best in FIGS. 3 and 5, a plurality of conductive apertures 22 (i.e., electrical contacts) extend into the mother board 12 from the upper major surface 18. The daughter card 14 is defined by a first or upper major surface 24, and an opposite second or lower major surface 26. The upper major surface 24 of the daughter card 14 includes a land grid array (LGA) defined by a plurality of electrical contact pads 28. The lower major surface 26 of the daughter card 14 also includes a LGA defined by a plurality of further electrical contact pads 30.

In one preferred embodiment, a microprocessor central processing unit (CPU) package 25 is adapted to be electrically coupled to the daughter card 14. A lower surface 27 of the CPU package 25 includes a ball grid array (BGA) defined by a plurality of electrical contact elements 29. To electrically couple the CPU package 25 to the daughter card 14, the electrical contact elements 29 on the lower surface 27 of the CPU package 25 are aligned with and soldered (in a known manner) to the electrical contact pads 28 on the upper surface 24 of the daughter card 14.

Figure 3:
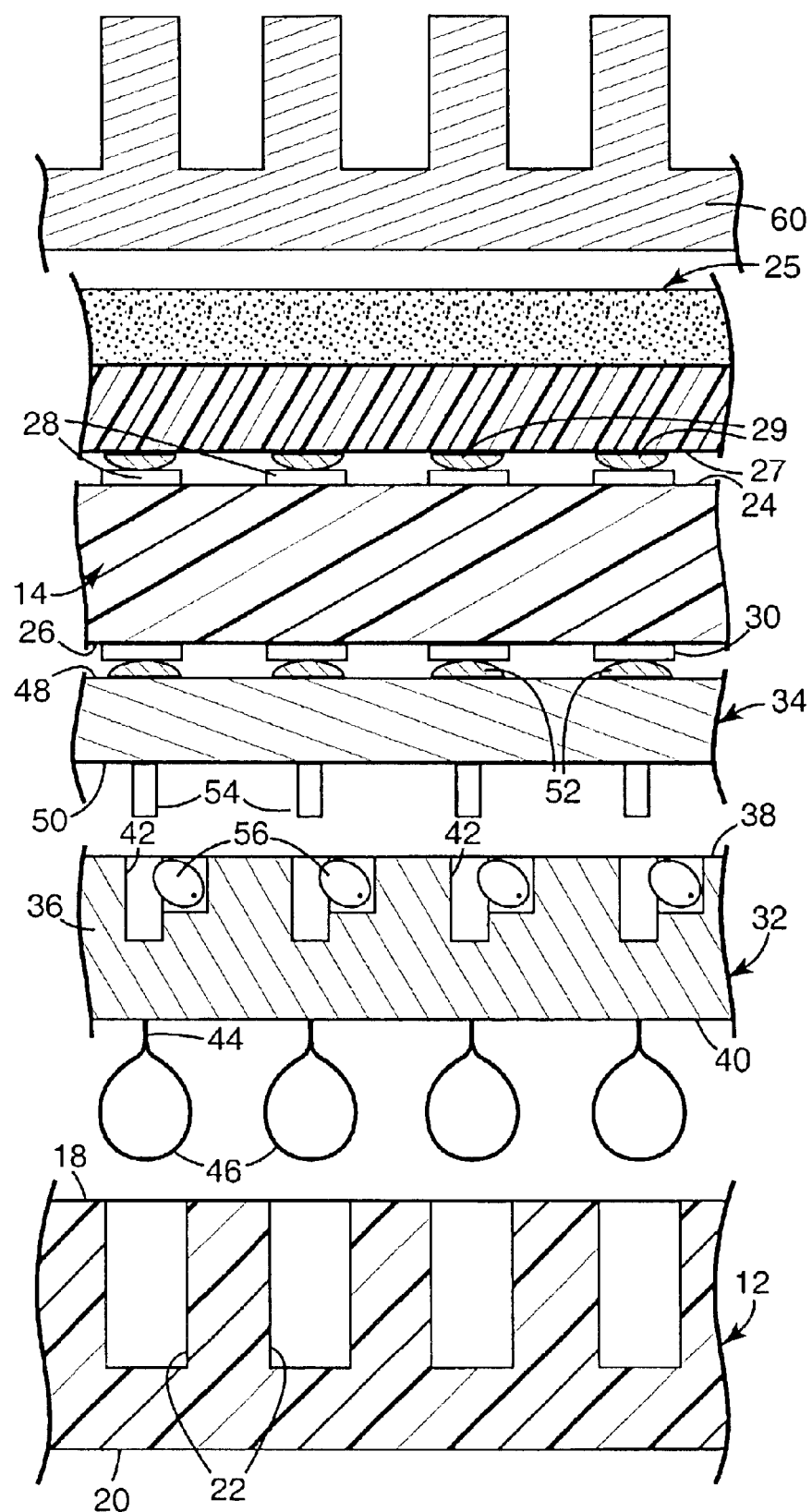
FIG. 3 is a partial, greatly enlarged side sectional view illustrating ready to be assembled electrical connection interfaces between a mother board, an electrical connector, a daughter card and a central processing unit (CPU) package of the PCB assembly in accordance with one embodiment of the present invention.
Figure 5:
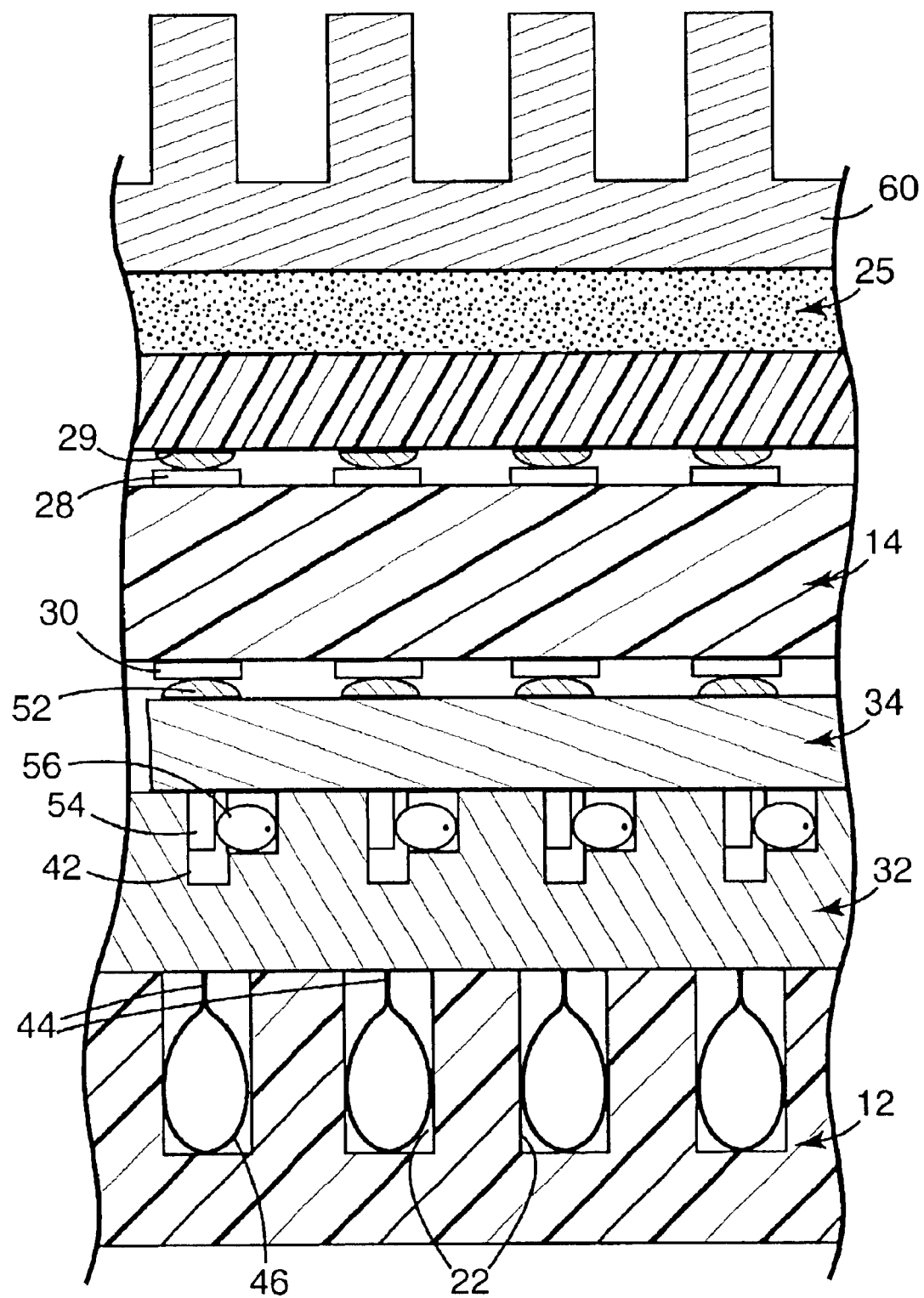
FIG. 5 is a partial, greatly enlarged side sectional view illustrating assembled electrical connection interfaces between the motherboard, the electrical connector, the daughter card and the CPU package of the PCB assembly in accordance with the one embodiment of present invention.

As best seen in FIGS. 1, 3 and 5, the electrical connector 16 is defined by a first or lower connector component 32 and a second or upper connector component 34. The lower connector component 32 includes a nonconductive body 36. In one preferred embodiment, the nonconductive body is molded of a suitable plastic material. The nonconductive body 36 includes a first or upper side 38 and an opposite second or lower side 40. A plurality of conductive apertures 42 (i.e., electrical contacts) extend into the lower connector component 32 from the upper side 38 of the nonconductive body 36. The lower connector component 32 further includes a plurality of conductive pins 44 that extend outwardly from the lower side 40 of the nonconductive body 36. As seen best in FIGS. 3 and 5, a free end of each conductive pin 44 is formed in a loop end 46.

To releasably, electrically couple the lower connector component 32 of the electrical connector 16 to the mother board 12, the plurality of conductive pins 44 are aligned with and inserted into the conductive apertures 22 of the motherboard 12. As the conductive pins 44 are inserted into the conductive apertures 22, the loop ends 46 of the conductive pins 44 flex inwardly (compare FIGS. 3 and 5) to form a releasable press fit (PF) interengagement between the conductive pins 44 of the lower connector component 32 and the conductive apertures 22 of the mother board 12. In other words, upon insertion of the conductive pins 44 into the conductive apertures 22, the sides of the loop ends 46 of the conductive pins 44 of the lower connector component 32 are placed in a mechanical shear or bind with the conductive apertures 22 of the mother board 12 to form a reliable electrical connection between the lower connector component 32 of the electrical connector 16 and the mother board 12. With the conductive pins 44 of the lower connector component 32 fully inserted into the conductive apertures 22 of the mother board 12, the lower side 40 of the nonconductive body 36 of the lower connector component 32 contacts and is supported by the upper major surface 18 of the mother board 12.

As seen best in FIG. 1, the upper connector component 34 of the electrical connector 16 includes a first or upper side 48 and an opposite second or lower side 50. The upper side 48 of the upper connector component 34 includes a ball grid array (BGA) defined by a plurality of electrical contact elements 52. A plurality of pin contacts 54 extend outwardly from the lower side 50 of the upper connector component 34 of the electrical connector 16. To electrically couple the upper connector component 34 to the daughter card 14, the electrical contact elements 52 on the upper side 48 of the upper connector component 34 are aligned with and soldered (in a known manner) to the electrical contact pads 30 on the lower surface 26 of the daughter card 14. Alternatively, to avoid soldering of the upper connector component 34 to the daughter card 14, the pin contacts 54 can be formed integrally with the daughter card 14 so as to extend outwardly from the lower major surface 26 thereof.

To releasably, electrically couple the daughter card 14 (with CPU package 25 and upper connector component 34 already attached thereto) to the mother board 12 (with lower connector component 32 already attached thereto), the plurality of pin contacts 54 of the upper connector component 34 are aligned with and inserted into the conductive apertures 42 of the lower connector component 34 (see FIGS. 3 and 5). As the pin contacts 54 are inserted into the conductive apertures 42, the pin contacts 54 rotate cam members 56 in the conductive apertures 42 (compare FIGS. 3 and 5) to form a releasable zero insertion force (ZIF) interengagement between the pin contacts 54 of the upper connector component 34 and the conductive apertures 42 of the lower connector component 32. In other words, upon insertion of the pin contacts 54 into the conductive apertures 42, the sides of the pin contacts 54 of the upper connector component 34 are placed in a mechanical shear or bind with the conductive apertures 42 of the lower connector component 32 to form a reliable electrical connection between the upper connector component 34 of the electrical connector 16 and the lower connector component 32 of the electrical connector 16, and thereby a reliable electrical connection between the daughter card 14 (with CPU package 25) and the mother board 12.

Figure 2:
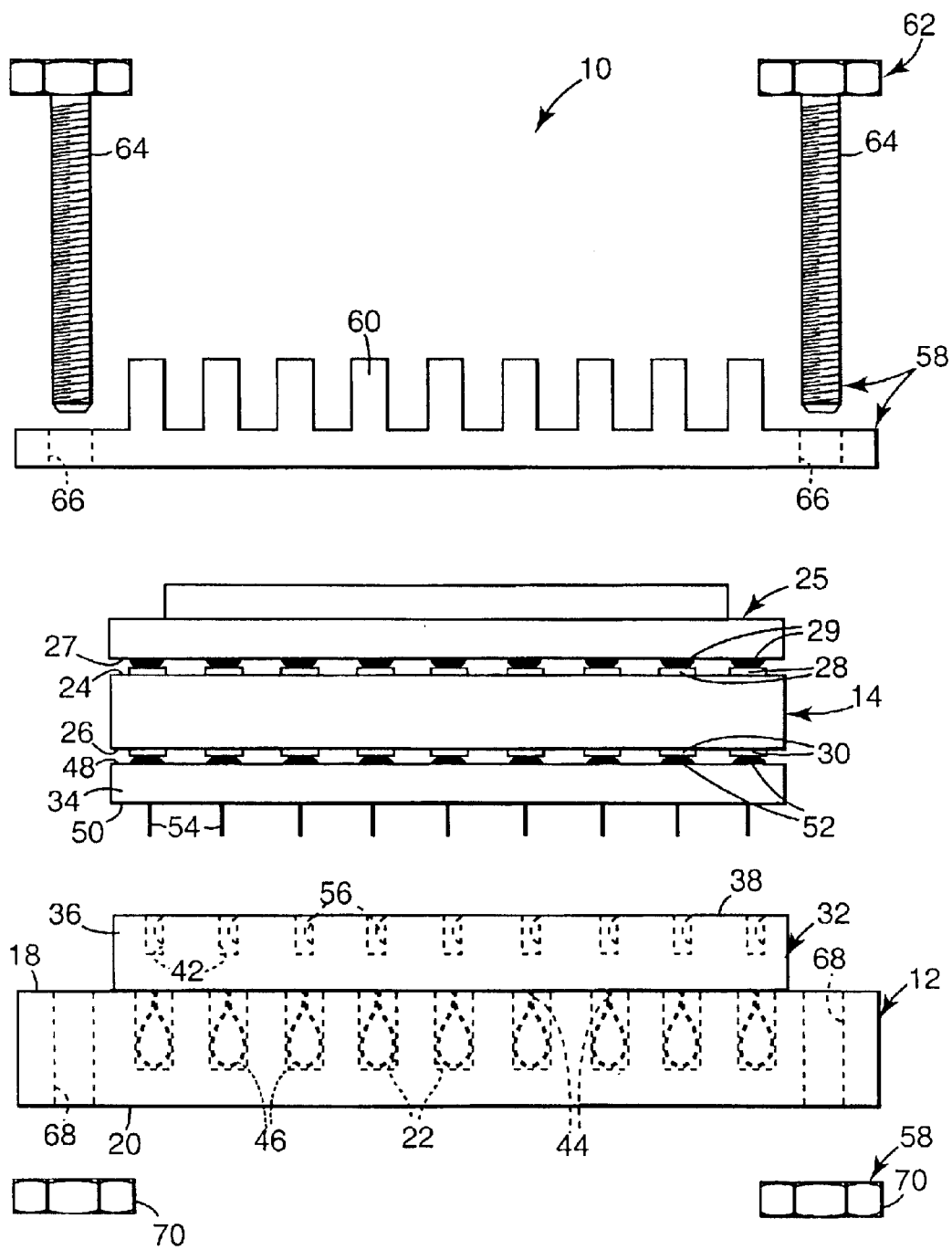
FIG. 2 is a side elevational view showing the components of the PCB ready for assembly.
Figure 4:
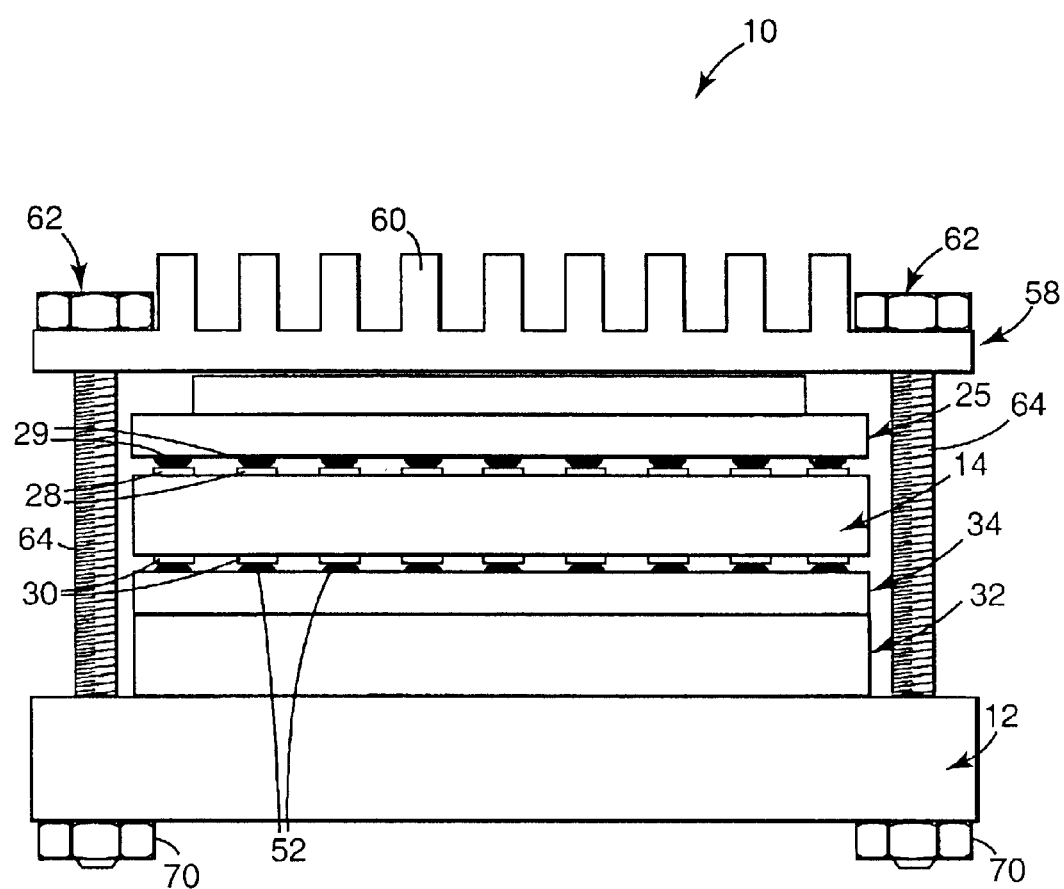
FIG. 4 is a side elevational view of the assembled PCB assembly.

As seen in FIGS. 1, 2 and 4, since ZIF interengagement between the pin contacts 54 of the upper connector component 34 and the conductive apertures 42 of the lower connector component 32, and the PF interengagement between the conductive pins 44 of the lower connector component 32 and the conductive apertures 22 of the mother board 12, are insufficient in and of themselves to firmly secure the daughter card 14 with CPU package 25 to the mother board 12, the PCB assembly 10 of the present invention employs a retention assembly 58.

The retention assembly 58 includes a heat sink 60, to remove heat generated by the motherboard 12/daughter card 12/CPU package 25 during operation, and a retention mechanism 62. The heat sink is positioned atop the CPU package 25 on the daughter card 14. The retention mechanism 62 acts between the heat sink 60 and the motherboard 12 to firmly secure the daughter card 14 (with CPU package 25) to the motherboard 12. As seen in FIG. 4, the daughter card 14 (with CPU package 25) is in essence "sandwiched" between the heat sink 60 and the motherboard 12 and is held in place by the retention mechanism 62.

The weight of the heat sink 60 together with the clamping forces provided by the retention mechanism 62 places the daughter card 14, CPU package 25 and the electrical connector 16 under compression loading. However, contrary to the solder connections, the PF interengagement between the conductive pins 44 of the lower connector component 32 and the conductive apertures 22 of the mother board 12, allows the lower side 40 of the nonconductive body 36 of the lower connector component 32 to contact and be supported by the upper major surface 18 of the mother board 12, thereby virtually eliminating the deterioration of the electrical connection between the lower connector component 32 and the mother board 12 due to compression loading, power cycling and thermal cycling.

In one preferred embodiment, the retention mechanism 62 includes a plurality of threaded fasteners 64 that are adapted to freely pass through openings 66 in the heat sink 60 and openings 68 in the motherboard 12. Nuts 70 are then threaded onto the threaded fasteners 64 to impart the above-described clamping forces and compression loading and to secure the daughter card 14 (With CPU package 25) to the motherboard 12. Alternatively, other means such as clamping levers could be used to provide the above described clamping forces and compression loading to secure the daughter card 14 (With CPU package 25) to the motherboard 12.

This PCB assembly 10 provides a reliable electrical connection between the motherboard 12 and the daughter card 14. In particular, the conductive pins 44 of the lower connector component 32 being received by the conductive apertures 22 of the mother board 12 in a PF manner, allows the nonconductive body 36 of the lower connector component 32 to contact and be supported by the upper major surface 18 of the mother board 12, thereby providing a reliable electrical connection that is not susceptible to deterioration as a result of compressive loads, thermal cycling and/or power cycling. Lastly, the PCB assembly 10 of the present invention is relatively easy and inexpensive to manufacture.

Although the present invention has been described with reference to preferred embodiments, workers skilled in the art will recognize that changes may be made in form and detail without departing from the spirit and scope of the invention.

What is claimed is:

1. A printed circuit board (PCB) assembly comprising:
   a PCB having a first major surface and an opposite second major surface;
   an electrical connector including:
      a connector component electrically coupled to the PCB, the connector component having a nonconductive body contacting and supported by the first major surface of the PCB; and
   a further PCB having a first major surface and an opposite second major surface, wherein the electrical connector electrically connects the further PCB to the PCB, wherein the electrical connector further includes:
      a further connector component electrically coupled to the second major surface of the further PCB, wherein the second major surface of the further PCB includes a plurality of electrical contacts, and wherein the further connector component includes a plurality of corresponding electrical contacts, the corresponding electrical contacts of the further connector component being adapted to engage the electrical contacts of the further PCB to electrically couple the further connector component to the further PCB, wherein the plurality of electrical contacts of the further PCB is a land grid array (LGA), wherein the plurality of corresponding electrical contacts of the further connector component is a ball grid array (BGA), and wherein the BGA is electrically coupled to the LGA by way of soldering.

2. The PCB assembly of claim 1 wherein the first major surface of the PCB includes a plurality of electrical contacts, and wherein the connector component includes a plurality of corresponding electrical contacts supported by the nonconductive body, the corresponding electrical contacts of the connector component engaging the electrical contacts of the PCB to electrically couple the connector component to the PCB.

3. The PCB assembly of claim 1, wherein the further connector component includes a first side and an opposite second side, wherein the BGA is on the first side of the further connector component, and wherein the second side of the further connector component includes a plurality of pin contacts.

4. The PCB assembly of claim 2 wherein the plurality of electrical contacts of the PCB is a plurality of conductive apertures extending into the PCB from the first major surface.

5. The PCB assembly of claim 4 wherein the plurality of corresponding electrical contacts of the connector component is a plurality of conductive pins extending outward from the nonconductive body of the connector component.

6. The PCB assembly of claim 5 wherein the plurality of conductive apertures of the PCB are adapted to receive the plurality of conductive pins of the connector component in a press fit (PF) manner.

7. The PCB assembly of claim 3 wherein the connector component includes a first side and an opposite second side, wherein the plurality of conductive pins extend outwardly from the second side of the connector component, and wherein the connector component defines a plurality of conductive apertures extending into the connector component from the first side, the plurality of conductive apertures of the connector component being adapted to receive the plurality of pin contacts of the further connector component in a zero insertion force (ZIF) manner to electrically couple the further PCB to the PCB.

8. The PCB assembly of claim 7 wherein the PCB is a motherboard and the further PCB is a daughter card.

9. The PCB assembly of claim 7, and further including:
a heat sink adapted to engage the further PCB; and
a retention mechanism for securing the heat sink to the PCB with the further PCB therebetween.

10. The PCB assembly of claim 7 wherein the PCB includes a plurality of conductive apertures extending into the PCB from the first major surface, and wherein the connector component includes a plurality of conductive pins extending outward from the nonconductive body of the connector component.

11. The PCB assembly of claim 8 wherein the first major surface of the daughter card includes a central processing unit (CPU).

12. The PCB assembly of claim 10 wherein the plurality of conductive apertures of the PCB are adapted to receive the plurality of conductive pins of the connector component in a press fit manner to electrically couple the connector component to the PCB.

13. A printed circuit board (PCB) assembly comprising:
a PCB having a first major surface and an opposite second major surface, the PCB including a plurality of conductive apertures extending into the PCB from the first major surface;
an electrical connector including:
a connector component having a first side and an opposite second side, the connector component having a plurality of conductive pins extending outwardly from the second side, wherein the plurality of conductive apertures of the PCB are adapted to receive the plurality of conductive pins of the connector component in a press fit (PF) manner to electrically couple the connector component to the PCB; and
a further PCB having a first major surface and an opposite second major surface, wherein the electrical connector electrically connects the further PCB to the PCB, wherein the electrical connector further includes:
a further connector component electrically coupled to the second major surface of the further PCB, wherein the second major surface of the further PCB includes a plurality of electrical contacts, and wherein the further connector component includes a plurality of corresponding electrical contacts, the corresponding electrical contacts of the further connector component being adapted to engage the electrical contacts of the further PCB to electrically couple the further connector component to the further PCB, wherein the plurality of electrical contacts of the further PCB is a land grid array (LGA), wherein the plurality of corresponding electrical contacts of the further connector component is a ball grid array (BGA), and wherein the BGA is electrically coupled to the LGA by way of soldering.

14. The PCB assembly of claim 13 wherein the further connector component includes a first side and an opposite second side, wherein the BGA is on the first side of the further connector component, and wherein the second side of the further connector component includes a plurality of pin contacts.

15. The PCB assembly of claim 14 wherein the connector component includes a first side and an opposite second side, wherein the plurality of conductive pins extend outwardly from the second side of the connector component, and wherein the connector component defines a plurality of conductive apertures extending into the connector component from the first side, the plurality of conductive apertures of the connector component being adapted to receive the plurality of pin contacts of the further connector component in a zero insertion force (ZIF) manner to electrically coupled the further PCB to the PCB.

* * * * *